(12) United States Patent
Chee et al.

(10) Patent No.: US 7,872,346 B1
(45) Date of Patent: Jan. 18, 2011

(54) POWER PLANE AND LAND PAD FEATURE TO PREVENT HUMAN METAL ELECTROSTATIC DISCHARGE DAMAGE

(75) Inventors: Soon Shin Chee, Sunnyvale, CA (US); Eugene O'Rourke, Dublin (IE)

(73) Assignee: Xilinx, Inc., San Jose, CA (US)

( * ) Notice: Subject to any disclaimer, the term of this patent is extended or adjusted under 35 U.S.C. 154(b) by 136 days.

(21) Appl. No.: 11/999,193

(22) Filed: Dec. 3, 2007

(51) Int. Cl.
*H01L 23/52* (2006.01)
*H01L 23/48* (2006.01)
*H01L 29/40* (2006.01)
*H01L 23/02* (2006.01)

(52) U.S. Cl. .................. 257/691; 257/786; 257/678; 257/738; 257/E23.079

(58) Field of Classification Search .......... 257/678, 257/691, 688, 697, 737, 738, 786, E23.015; 361/601, 794, 777; 174/250
See application file for complete search history.

(56) References Cited

U.S. PATENT DOCUMENTS

| | | | | |
|---|---|---|---|---|
| 5,177,670 | A * | 1/1993 | Shinohara et al. | 361/738 |
| 5,635,761 | A * | 6/1997 | Cao et al. | 257/700 |
| 5,869,869 | A * | 2/1999 | Hively | 257/355 |
| 5,970,321 | A * | 10/1999 | Hively | 438/123 |
| 6,201,298 | B1 * | 3/2001 | Sato et al. | 257/691 |
| 6,407,345 | B1 * | 6/2002 | Hirose et al. | 174/261 |
| 7,157,794 | B2 * | 1/2007 | Mori | 257/728 |
| 7,239,524 | B2 * | 7/2007 | Chung et al. | 361/760 |
| 7,242,093 | B2 * | 7/2007 | Ueda | 257/737 |
| 7,473,999 | B2 * | 1/2009 | Lin et al. | 257/738 |
| 7,484,897 | B2 * | 2/2009 | Ono et al. | 385/53 |
| 2001/0037896 | A1 * | 11/2001 | Asai et al. | 174/255 |
| 2003/0085465 | A1 * | 5/2003 | Kajimoto et al. | 257/734 |
| 2003/0189251 | A1 * | 10/2003 | Terui et al. | 257/738 |
| 2005/0126820 | A1 * | 6/2005 | Fukuoka et al. | 174/260 |
| 2005/0285147 | A1 * | 12/2005 | Usui et al. | 257/202 |
| 2006/0192282 | A1 * | 8/2006 | Suwa et al. | 257/723 |
| 2006/0291177 | A1 * | 12/2006 | Choi et al. | 361/780 |
| 2007/0018299 | A1 * | 1/2007 | Koo et al. | 257/686 |
| 2008/0063342 | A1 * | 3/2008 | Ono et al. | 385/88 |
| 2008/0203567 | A1 * | 8/2008 | Kondo | 257/738 |
| 2008/0265413 | A1 * | 10/2008 | Chou et al. | 257/737 |
| 2009/0045512 | A1 * | 2/2009 | Hedler et al. | 257/738 |
| 2009/0114914 | A1 * | 5/2009 | Lin | 257/48 |
| 2009/0268418 | A1 * | 10/2009 | Choi et al. | 361/764 |
| 2009/0268419 | A1 * | 10/2009 | Choi et al. | 361/767 |

OTHER PUBLICATIONS

Kunz, Hans, et al., "HBM Stress of No-Connect IC Pins and Subsequent Arc-Over Events that Lead to Human-Metal-Discharge-Like Events into Unstressed Neighbor Pins", Texas Instruments, Inc., EOS/ESD Symposium 06-24, 1A.4-1-1A.4-8 pages.

* cited by examiner

*Primary Examiner*—Teresa M Arroyo
(74) *Attorney, Agent, or Firm*—William L. Paradice, III; John J. King

(57) ABSTRACT

An IC package includes an IC die mounted on a substrate that includes an ESD protection structure formed within the substrate to dissipate any charge accumulation associated with the package's no-connect pins resulting from human body model ESD and/or voltage spikes during package testing. For some embodiments, the ESD protection structure includes a resistive element formed in the substrate between the no-connect pin and a power plane. For other embodiments, the ESD protection structure includes a conductive ring formed in the substrate and laterally surrounding the land pad of the no-connect pin.

15 Claims, 10 Drawing Sheets

POWER PLANE AND LAND PAD FEATURE TO PREVENT HUMAN METAL ELECTROSTATIC DISCHARGE DAMAGE

FIELD OF INVENTION

This invention relates generally to electrostatic discharge protection of integrated circuit devices, and more particularly, to an integrated circuit device having built-in electrostatic discharge protection features.

BACKGROUND

Integrated circuit (IC) devices typically include one or more IC dice mounted on a substrate and housed in a protective package made of suitable material such as plastic, ceramic or metal. There are several package types including ball grid arrays (BGAs), pin grid arrays (PGAs), plastic leaded chip carriers, and plastic quad flat packs. Each of the package types is typically available in numerous sizes and configurations. The package type and configuration selected by an IC manufacturer for a particular IC chip may be determined by the size and complexity of the IC chip and/or in accordance with a customer's requirements.

For example, in a BGA package, an integrated circuit (IC) die or chip having a plurality of bonding pads formed on an active surface thereof is typically mounted on a top surface of a substrate. The substrate has a plurality of conductive traces that are connected (for example, by wire bonding, tape automated bonding, or flip-chip bonding) to corresponding bonding pads of the IC die. An array of solder balls (typically arranged in a rectangular grid) is formed on the bottom surface of the substrate (e.g., opposite the surface to which the IC die is mounted). The substrate includes various interconnection layers (e.g., power plane, ground plane, and signal lines) and vias that provide electrical paths between the conductive traces on the top surface of the substrate and corresponding solder balls formed on the bottom surface of the substrate. The package is typically placed on a printed wiring board, and heated to reflow the solder balls on the bottom surface of the substrate to form connections between the IC die and elements on the printed wiring board.

To reduce manufacturing costs, many IC manufacturers use a standard substrate to accommodate different variations of an IC chip, or a family of similar chips. Typically, the standard substrate includes a predetermined number of solder balls and corresponding conductive traces that can be electrically connected to the bonding pads of an IC die that is mounted on the substrate. Because the standard substrate can be used to receive IC dice having different numbers of bonding pads, for any given package, the number of bonding pads on the IC die may be less than the number of conductive traces and solder balls formed on the substrate. As a result, some of these IC packages may include one or more "extra" solder balls that are not connected to any of the bonding pads formed on the mounted IC die. These extra solder balls are commonly referred to as "no-connect pins."

For example, FIGS. 1A-1C show simplified top, bottom, and sectional views, respectively, of a typical BGA package 100. BGA package 100 includes an IC chip or die 110 mounted on a top surface 120t of a substrate 120. A plurality of conductive bonding pads 111 formed on an active surface 110a of die 110 are connected to corresponding conductive traces 121, 122, and 123 formed on substrate 120 via wire bond connections 112. Substrate 120, which is made of a suitable dielectric material such as resin or epoxy, includes a plurality of land pads 124 formed on its bottom surface 120b, and includes a well-known interconnect structure including embedded metal layers 128b and 128c for providing power planes (e.g., VDD and VSS) and including conductive vias 125 for providing conductive paths between land pads 124 and corresponding bonding pads 111 of die 110 through conductive traces 123. Solder balls 140 mounted to corresponding land pads 124 provide electrical connections between package 100 and other external devices or systems (not shown for simplicity). Note that in the simplified illustrations of FIGS. 1A-1C, package 100 is shown to include 25 solder balls 140, and die 110 is shown to include 14 bonding pads 111. Thus, because the number of solder balls 140 is greater than the number of die pads 111 for the exemplary IC package 100, a number of solder balls 140 such as solder ball 140d are not connected to any corresponding bonding pads 111 of die 110, and are thus designated as NC pins.

For purposes of discussion herein, solder balls 140a and 140e are active pins that provide signals to and from die 110, solder balls 140b and 140c are power pins that provide supply voltages (e.g., VDD and VSS) to die 110, and solder ball 140d is an NC pin. For example, signals are transmitted between active solder ball 140a and corresponding active die pad 111a through bonding wire 112a, conductive trace 123a, conductive via 125a, and land pad 124a, and signals are transmitted between active solder ball 140e and corresponding active die pad 111e through bonding wire 112e, conductive trace 123e, conductive via 125e, and land pad 124e. A first voltage supply such as VDD is provided from power pin 140b to corresponding die pad 111b through land pad 124b, power plane 128b, conductive via 125b, conductive trace 122, and bonding wire 112b. A second voltage supply such as VSS is provided from power pin 140c to corresponding die pad 111c through land pad 124c, conductive via 125c, power plane 128c, conductive trace 121, and bonding wire 112c.

As mentioned above, solder ball 140d is an NC pin. Together, land pad 124d of the NC pin 140d and metal layer 128c form a capacitor that can store an undesirable accumulation of charge in the dielectric material 150 surrounding the NC pin 140d. Because there is no circuit connection to the NC pin's land pad 124d, the charge accumulation in dielectric area 150 can result in an undesirable voltage arc to adjacent active pins, such as active pin 140e, that can damage the IC package. For example, applying a test voltage to the NC pin 140d during quality test operations can result in undesirable charge accumulation in the dielectric material 150 surrounding NC pin 140d, which in turn can cause a damaging voltage arc to nearby pins. Further, during handling of package 100 by humans, electrostatic discharge (ESD) associated with a phenomenon commonly known as human body model (HBM) stress can result in charge accumulation surrounding the NC pin 140d, which as described above can cause a damaging voltage arc to nearby pins.

One solution to the ESD problem with NC pins in IC packages such as BGA package 100 is to avoid testing the no-connect pins for ESD susceptibility prior to delivery. However, although standards commissions such as JEDEC currently do not require such testing of NC connect pins, it is likely that future ESD specifications will require the no-connect pins to be tested for ESD susceptibility. Further, avoiding the application of a test probe to NC pins during testing operations does not prevent charge accumulation around the NC pin caused by HBM ESD during handling of the IC package. Another solution is to selectively connect the no-connect pins to ESD protection circuitry (not shown for simplicity) provided within the IC die. However, providing ESD protection circuitry for NC pins in the IC die, as well as including circuitry that can selectively connect the NC pins to the ESD protection circuitry, undesirably increases chip size and complexity.

As more and more solder balls (or pins) are provided on IC packages to achieve greater packing densities, the distance between the pins decreases, which exacerbates ESD problems associated with the NC pins. Therefore, there is a need to provide ESD protection for an IC package's NC pins without including ESD circuitry that increases IC chip size and complexity.

SUMMARY

A method and apparatus are disclosed that protect an IC package from damage resulting from ESD stress at the package's no-connect pins. In accordance with the present invention, an ESD protection structure is provided within the package substrate to safely dissipate any charge accumulation in the dielectric material surrounding the package's no-connect pins so that the charge accumulation does not create an undesirable voltage arc to neighboring pins that can damage the package substrate and/or the IC chip.

For some embodiments, the ESD protection structure is a resistive element formed in a portion of the substrate between the land pad of the no-connect pin and a power plane embedded in the substrate, where the resistive element provides a discharge path through which any charge accumulation proximate the no-connect pin can be safely dissipated (e.g., to ground potential), thereby avoiding a voltage arc to adjacent active pins that may damage the substrate and/or the IC chip.

For other embodiments, the ESD protection structure is a conductive ring formed within the substrate and laterally surrounding the land pad of the no-connect pin. A conductive via may electrically connect the conductive ring and the nearest power plane of the package. Undesirable charge accumulated around the no-connect pin arcs to the conductive ring and safely discharges to the power plane through the conductive via, thereby avoiding a voltage arc to adjacent active pins that can damage the substrate and/or the IC chip. For one embodiment of the conductive ring, the land pad of the no-connect pin includes a protruding portion that laterally extends beyond the circular portion of the land pad so that the protruding portion is in close proximity to the conductive ring, thereby encouraging voltage arcs from the land pad to the conductive ring.

By providing the ESD protection structure within the package substrate, embodiments of the present invention are able to protect against ESD stress associated with no-connect pins without including additional ESD protection circuitry or ESD selection circuitry in the IC chip, which would otherwise undesirably increase the size and complexity of the IC chip.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are discussed below in the context of an exemplary BGA IC package for simplicity only. It is to be understood that embodiments of the present invention are equally applicable to other types of IC packages such as, for example, pin grid arrays (PGAs), plastic leaded chip carriers, and plastic quad flat packs. Further, although exemplary IC dice described below are connected to substrates via wire bonding, other well-known connection techniques such as flip-chip connections can be used. In addition, as used herein, the term "BGA" refers to any IC product or package having solder balls for connecting to an external circuit or system. Although shown in the accompanying figures as solder balls, for other embodiments, pins or other suitable package leads can be used to provide electrical connections between the IC package and external devices or systems. Thus, the term "solder ball," as used herein, refers to any package lead such as a solder ball or pin, and the term "no-connect pin" refers to any package lead, such as a solder ball or pin, that is not connected to any circuitry within the package substrate or packaged die. Accordingly, the present invention is not to be construed as being limited to specific examples described herein but rather includes within its scope all embodiments defined by the appended claims.

Figure 1A:
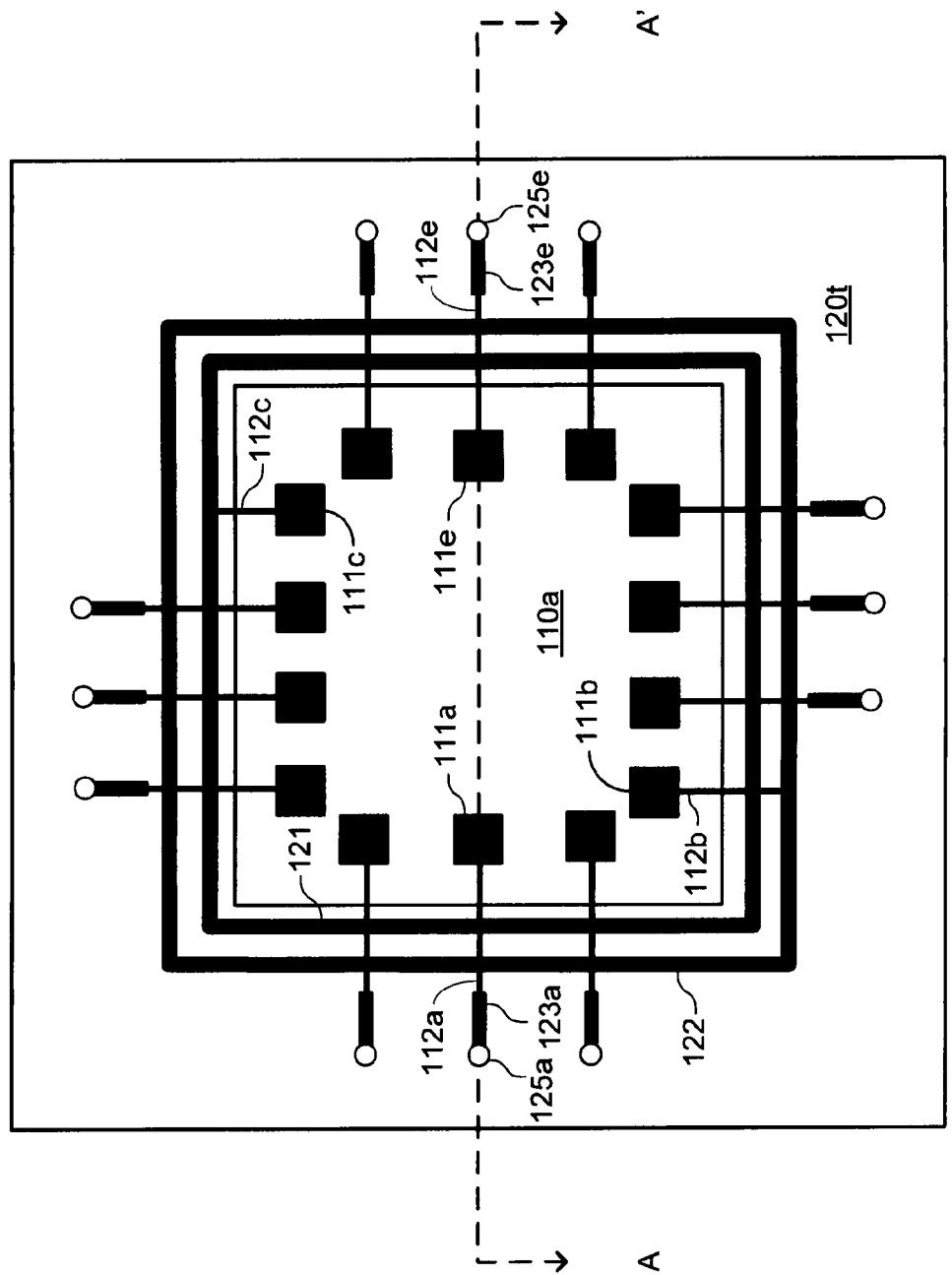
FIG. 1A is a top plan view of a conventional IC package.
Figure 1B:
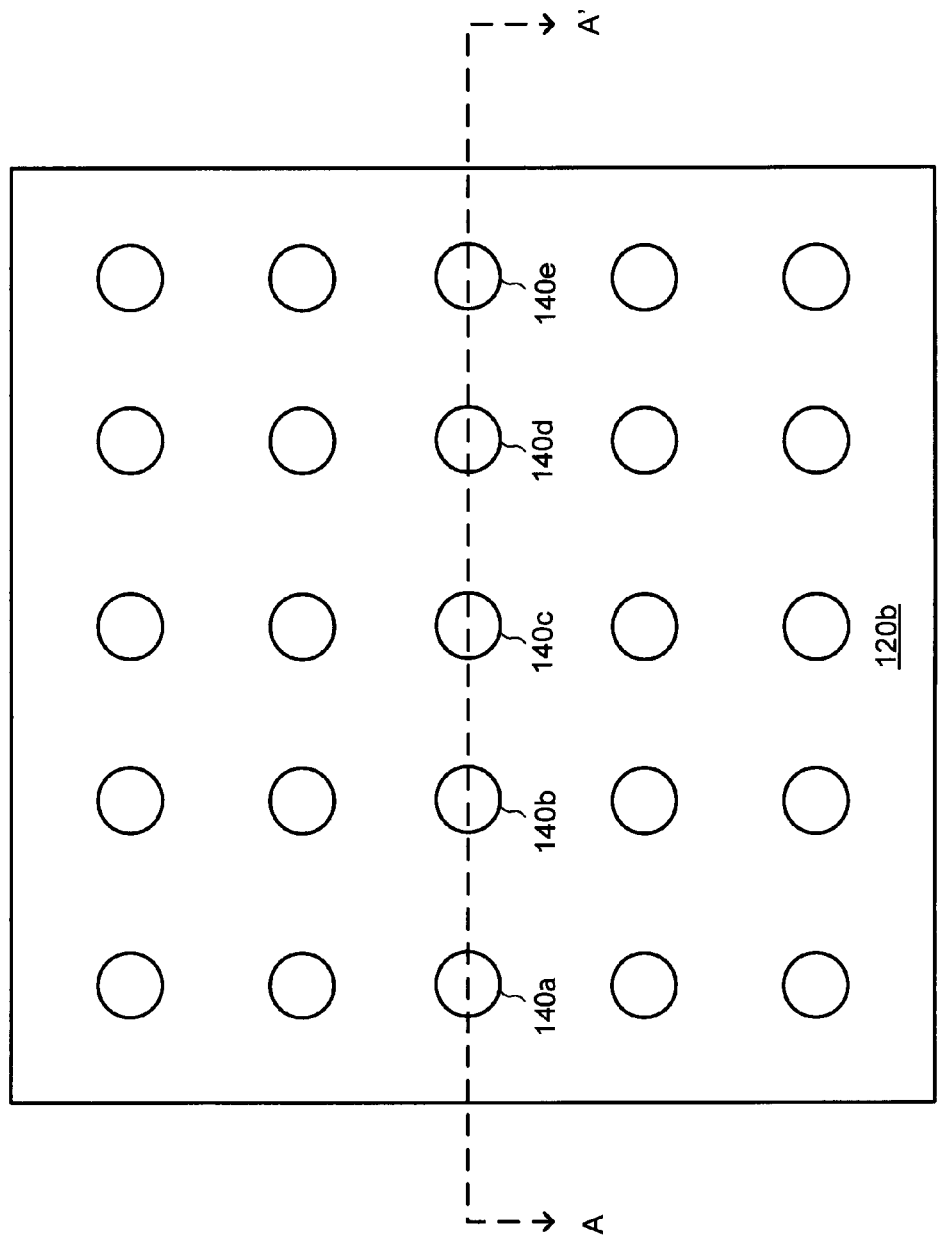
FIG. 1B is a bottom plan view of the conventional IC package of FIG. 1A.
Figure 1C:
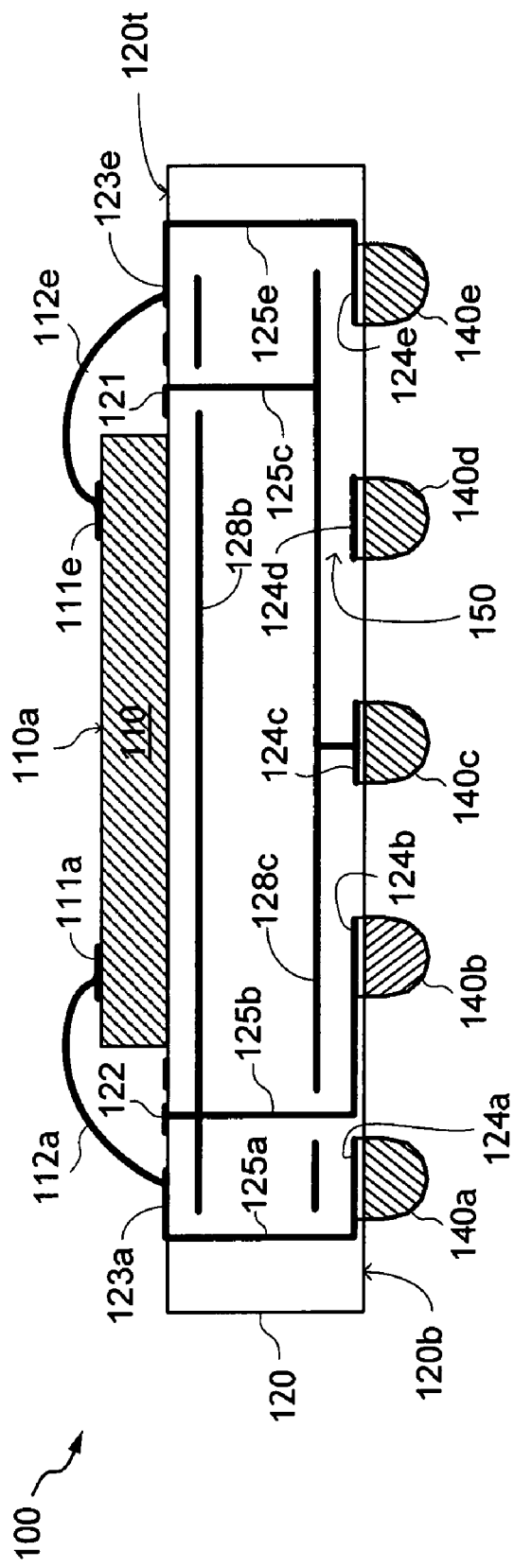
FIG. 1C is a sectional side view of the IC package of FIGS. 1A-1B taken along line AA'.
Figure 2A:
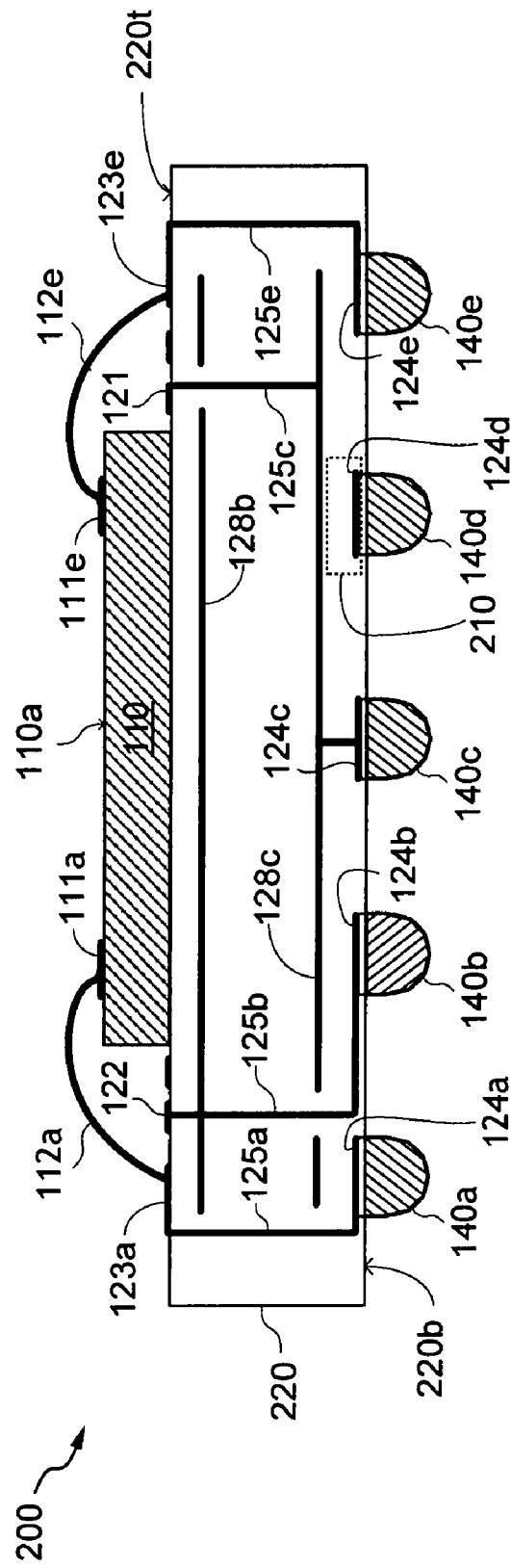
FIG. 2A is a sectional side view of an IC package having an ESD protection structure in accordance with some embodiments of the present invention.

FIG. 2A shows a sectional view of an IC package 200 having an ESD protection structure 210 for NC pins in accordance with some embodiments of the present invention. The architecture of IC package 200, which includes a die 110 mounted to a substrate 220, is similar to that of IC package 100 of FIGS. 1A-1C, except that IC package 200 includes ESD protection structure 210. Thus, for purposes of discussion herein, the top view of IC package 200 is similar to that depicted in FIG. 1A.

For purposes of discussion herein, IC package 200 includes more solder balls 140 than die pads 111, and therefore IC package 200 includes a number of solder balls 140 that are not connected to any corresponding die bonding pads 111 (and which are referred to herein as no-connect pins). For the present example, solder balls 140a and 140e are active pins that provide signals to and from die 110, solder balls 140b and 140c are power pins that provide supply voltages (e.g., VDD and VSS) to die 110, and solder ball 140d is an NC pin. For example, signals are transmitted between active solder ball 140a and corresponding active die pad 111a through bonding wire 112a, conductive trace 123a, conductive via 125a, and land pad 124a, and signals are transmitted between active solder ball 140e and corresponding active die pad 111e through bonding wire 112e, conductive trace 123e, conductive via 125e, and land pad 124e. A first voltage supply such as VDD is provided from power pin 140b to corresponding die pad 111b through land pad 124b, power plane 128b, conductive via 125b, conductive trace 122, and bonding wire 112b. A second voltage supply such as VSS is provided from power pin 140c to corresponding die pad 111c through land pad 124c, conductive via 125c, power plane 128c, conductive trace 121, and bonding wire 112c. For other embodiments, power plane 128b can provide VSS, and power plane 128c can provide VDD.

Die 110, which can be any suitable IC chip that includes any number of semiconductor circuits including, for example, a programmable logic device, can be electrically connected to substrate 220 using any well-known techniques. Thus, although shown in FIG. 2A as having bonding wire connections 111 between die 110 and substrate 220, die 110 can be connected to substrate 220 using other techniques such as flip-chip connections. Substrate 220 can be formed of any suitable material including, for example, resin, epoxy, or other polymer materials. Further, for actual embodiments, IC package 200 can include any number of solder balls 140, conductive traces 112, power planes 128-129, and conductive vias 125, and die 110 can include any number of die pads 111.

As discussed above, solder ball 140d is a no-connect (NC) pin, and is thus susceptible to undesirable charge accumulation in the area of substrate 220 surrounding its land pad 124d (e.g., resulting from test probes and/or from HBM stress). In accordance with the present invention, ESD protection structure 210 is formed in a portion of substrate 220 proximate to the NC pin's land pad 124d, as generally illustrated by the dashed box in FIG. 2A. The ESD protection structure 210 is electrically coupled to power plane 128c so that when the NC pin 140d receives an ESD stress, the resulting charge accumulation in the substrate portion around its land pad 124d will be diverted by ESD protection structure 210 to power plane 128c. As a result, undesirable charge accumulation in the substrate area around the NC pin 140d is safely discharged to power plane 128c, instead of arcing to an adjacent pin (e.g., to adjacent active pin 140e) and damaging the substrate and/or die 110. For some embodiments, ESD protection structure 210 is contained entirely within the substrate 220 (e.g., as shown in FIG. 2A), and therefore does not consume any valuable area of die 110.

Figure 2B:
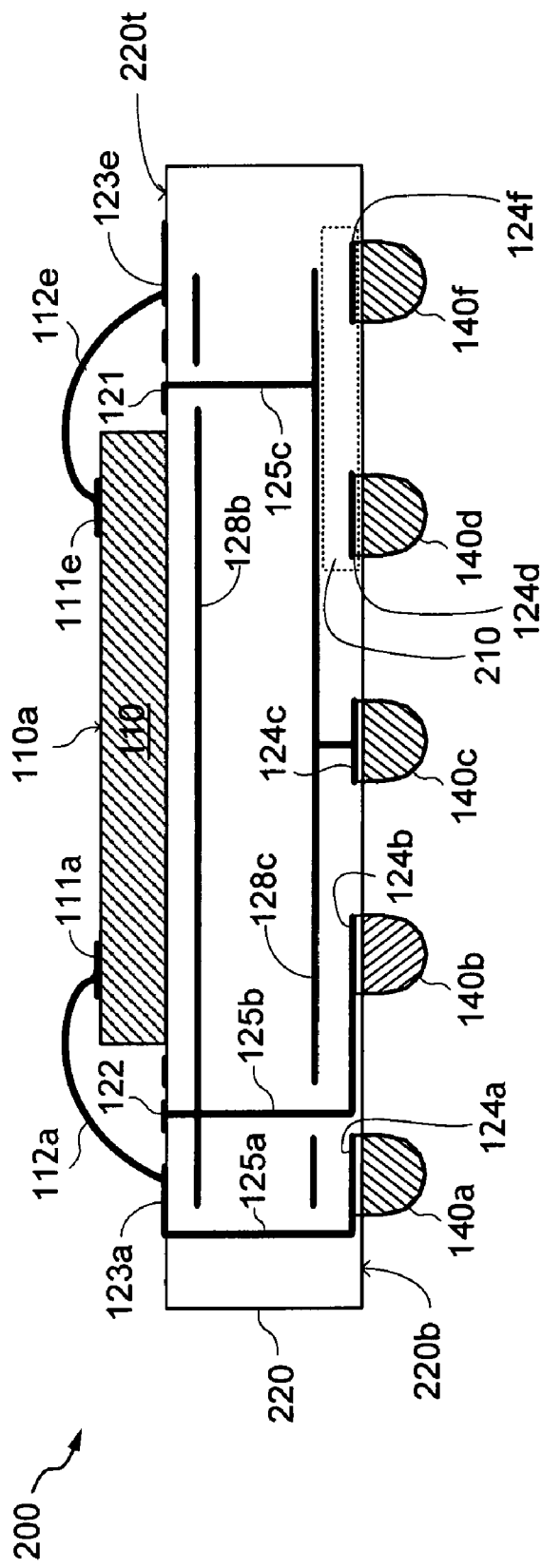
FIG. 2B is a sectional side view of an IC package having a common ESD protection structure for two corresponding no-connect pins in accordance with some embodiments of the present invention.

Although described herein as including one NC pin 140d, actual embodiments of IC package 200 can include any number of NC pins. For some embodiments, substrate 220 can include a separate ESD protection structure 210 for each NC pin. For other embodiments, one or more adjacent NC pins can share a common ESD protection structure 210 (e.g., to minimize fabrication costs), as depicted in FIG. 2B, where NC pins 140d and 140f share common ESD protection structure 210, the common ESD protection structure 210 overlies each of the corresponding NC pins. In this manner, the common ESD protection structure can dissipate charge accumulation associated with multiple NC pins.

Figure 3A:
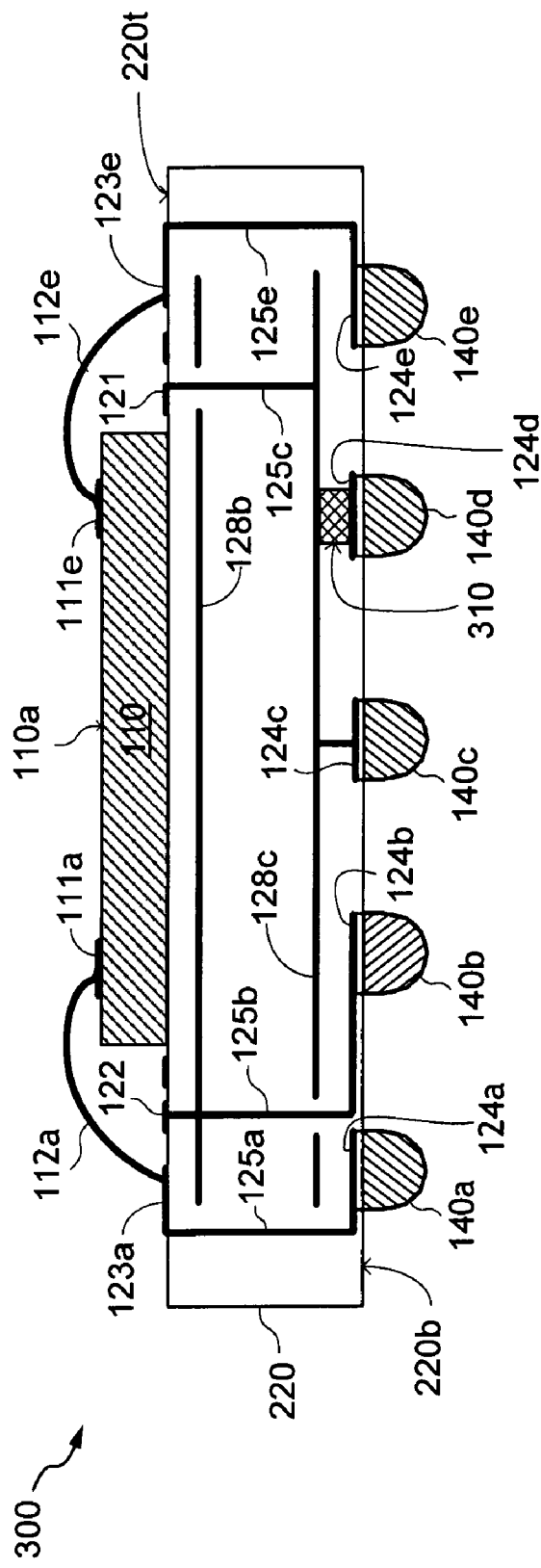
FIG. 3A is a sectional side view of one embodiment of the IC package of FIG. 2A having an embedded resistive structure that provides ESD protection.
Figure 3B:
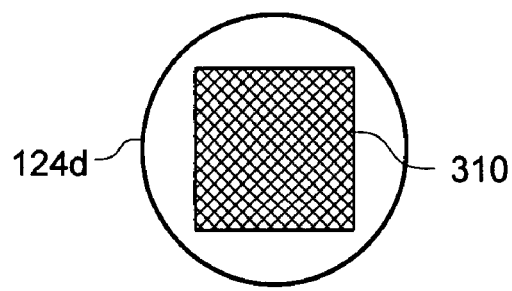
FIG. 3B is a top plan view of one embodiment of the resistive structure of FIG. 3A overlying the land pad of a corresponding no-connect pin.

FIG. 3A shows an IC package 300 including a resistive element 310 that is one embodiment of ESD protection structure 210 of FIG. 2A, and FIG. 3B shows a top plan view of resistive element 310 overlying land pad 124d of the NC pin. Resistive element 310 is formed within a portion of substrate 220 between the land pad 124d of NC pin 140d and power plane 128c. Along with the capacitor formed between NC land pad 124d and power plane 128c, resistive element 310 forms a resistor-capacitor (RC) network that safely dissipates any undesirable accumulation of charge around the NC pin's land pad 124 to power plane 128c, thereby preventing undesirable arcs from NC pin 140d to adjacent pins that can otherwise damage substrate 220 and/or die 110.

Resistive element 310 can be formed using any suitable technique. For some embodiments, resistive element 310 can be a resistive material that is formed in a portion of substrate 220 overlying land pad 124d of NC pin 140d. For some embodiments, the resistive element 310 may be a resistive material deposited in a cavity formed in a portion of the substrate overlying the land pad of the NC pin.

Figure 4A:
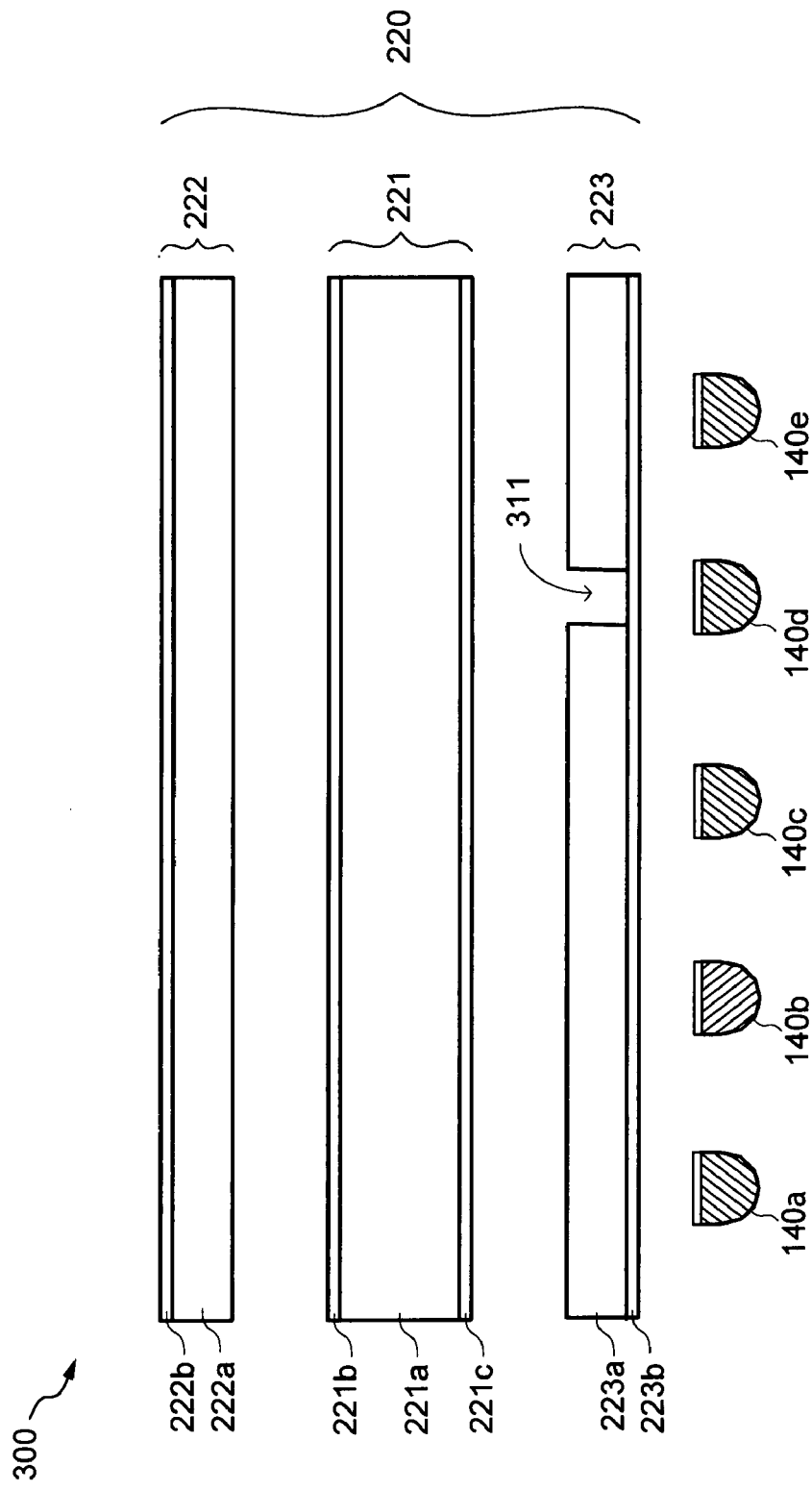
FIGS. 4A-4B are exploded sectional views illustrating an exemplary formation of the resistive structure formed in the substrate of the IC package of FIG. 3A.

More specifically, for some embodiments, substrate 220 can include separately formed substrate layers 221-223 that are subsequently mounted to each other to form a single substrate 220, as depicted in FIG. 4A (although for other embodiments other numbers of layers may be used to form substrate 220). The first substrate layer 221, which is commonly referred to as the substrate core, includes a dielectric layer 221a having a first metal layer 221b formed on a top surface thereof and a second metal layer 221c formed on a bottom surface thereof. The first metal layer 221b is patterned in a well-known manner to form power plane 128b, and the second metal layer 221c is patterned in a well-known manner to form power plane 128c. The second substrate layer 222 includes a dielectric layer 222a having a metal layer 222b formed on a top surface thereof. The metal layer 222b is patterned in a well-known manner to form conductive traces 121-123. The third substrate layer 223 includes a dielectric layer 223a having a metal layer 223b formed on a bottom surface thereof. The metal layer 223b is patterned in a well-known manner to form land pads 124. Thereafter, the three layers 221-223 are mounted together using well-known techniques to form substrate 220, conductive vias (not shown in FIGS. 4A-4B for simplicity) are formed in the substrate layer 220 using well-known techniques (e.g., such as drilling), and solder balls 140 are formed on the bottom surface of substrate 220 in a well-known manner.

The dielectric layers 221a, 222a, and 223a can be any suitable material such as, for example, epoxy, resin, and so on. The metal layers 221b, 221c, 222b, and 223b can be any suitable conductive material such as, for example, copper.

Figure 4B:
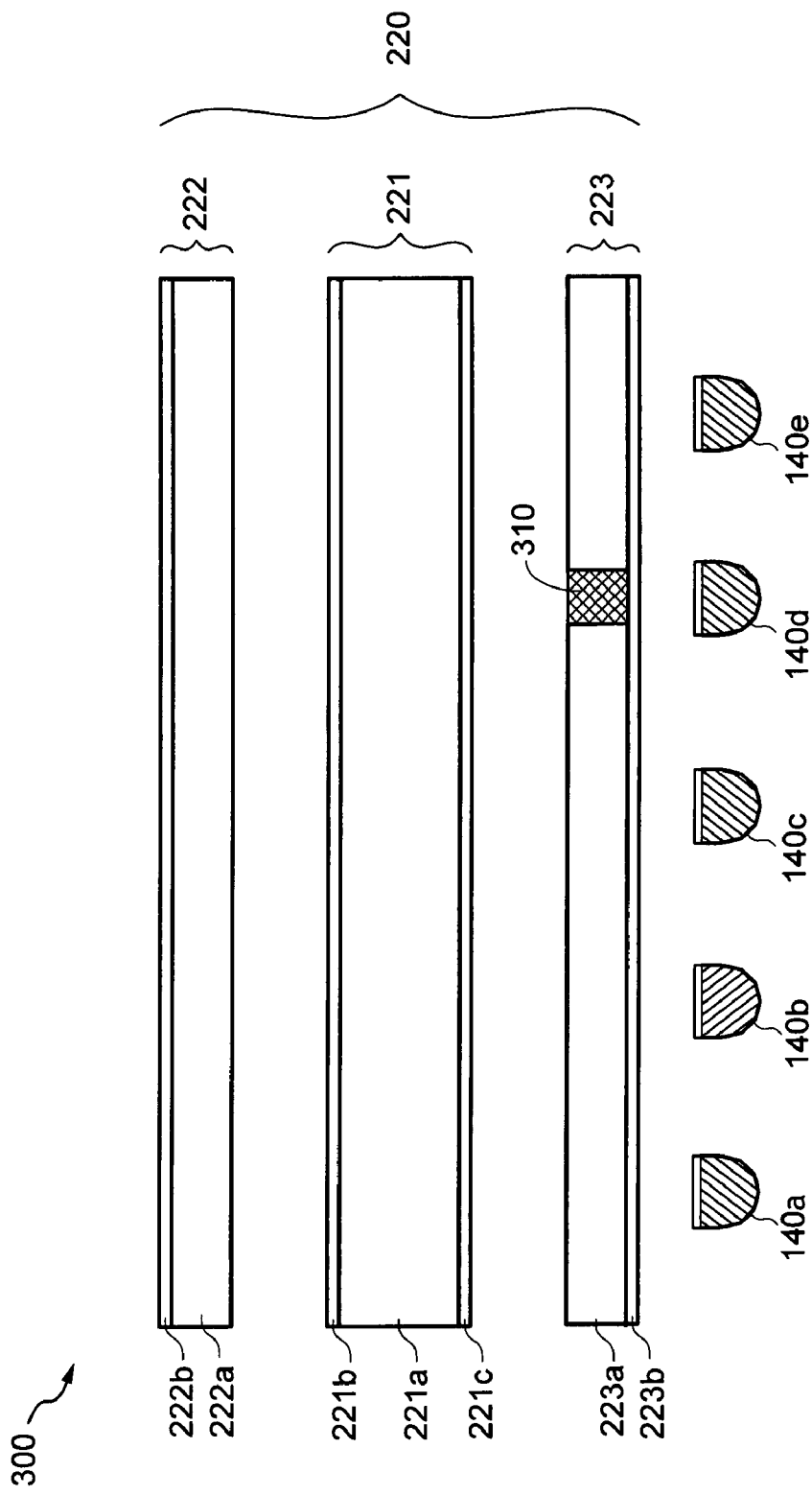

In accordance with some embodiments of the present invention, prior to attaching substrate layers 221 and 223 together, a cavity 311 is formed in a top surface of substrate layer 223 using any suitable technique (e.g., such as laser drilling). The cavity 311 is positioned within substrate layer 223a so as to overlie the land pad of NC pin 140d, and extends down to metal layer 223b (a portion of which ultimately forms the land pad of NC pin 140d), as depicted in FIG. 4A. Then, a resistive material is deposited in cavity 311 to form resistive element 310, as depicted in FIG. 4B. For some embodiments, the resistive material is a resistive ink that can be printed into cavity 311 using well-known techniques similar to those employed to form substrate capacitors. For other embodiments, resistive element 310 can be formed by depositing a suitable resistive material in cavity 311 using other well-known techniques.

Resistive element 310 can be any suitable resistive material having a resistivity that allows charge accumulated in the substrate portion proximate the NC pin's land pad to safely dissipate to power plane 128c without creating a short circuit between the NC pin's land pad and the power plane. For some embodiments, resistive element 310 has a resistivity that is several orders of magnitude less than the resistivity of substrate 220.

Figure 3C:
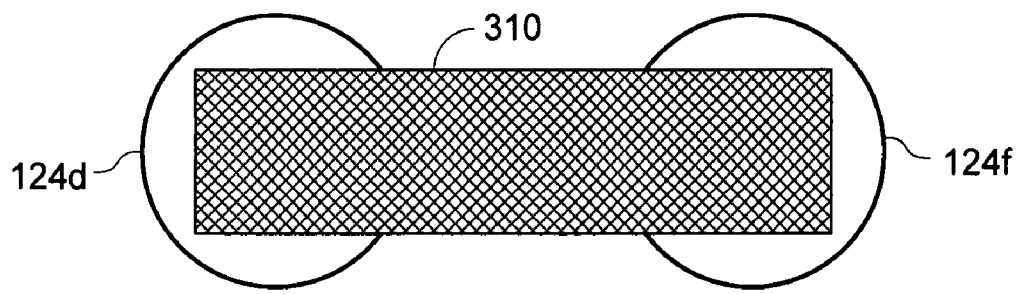
FIG. 3C is a top plan view of another embodiment of the resistive structure of FIG. 3A overlying the land pads of two corresponding adjacent no-connect pins.

For embodiments in which a common ESD protection structure 210 is shared by more than one NC pin, such as generally depicted by adjacent NC pins 140d and 140f of FIG. 2B, the resistive element 310 extends laterally over the land pads of the corresponding NC pins, as depicted in FIG. 3C, which shows a top plan view of resistive element 310 overlying land pads 124d and 124f of corresponding NC pins 140d and 140f, respectively, of FIG. 2B.

Figure 5B:
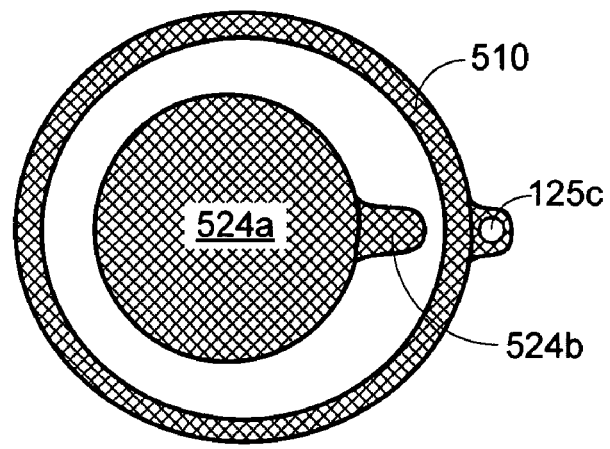
FIG. 5B is a top plan view of one embodiment of the conductive ring structure of FIG. 5A overlying the land pad of a corresponding no-connect pin.
Figure 5A:
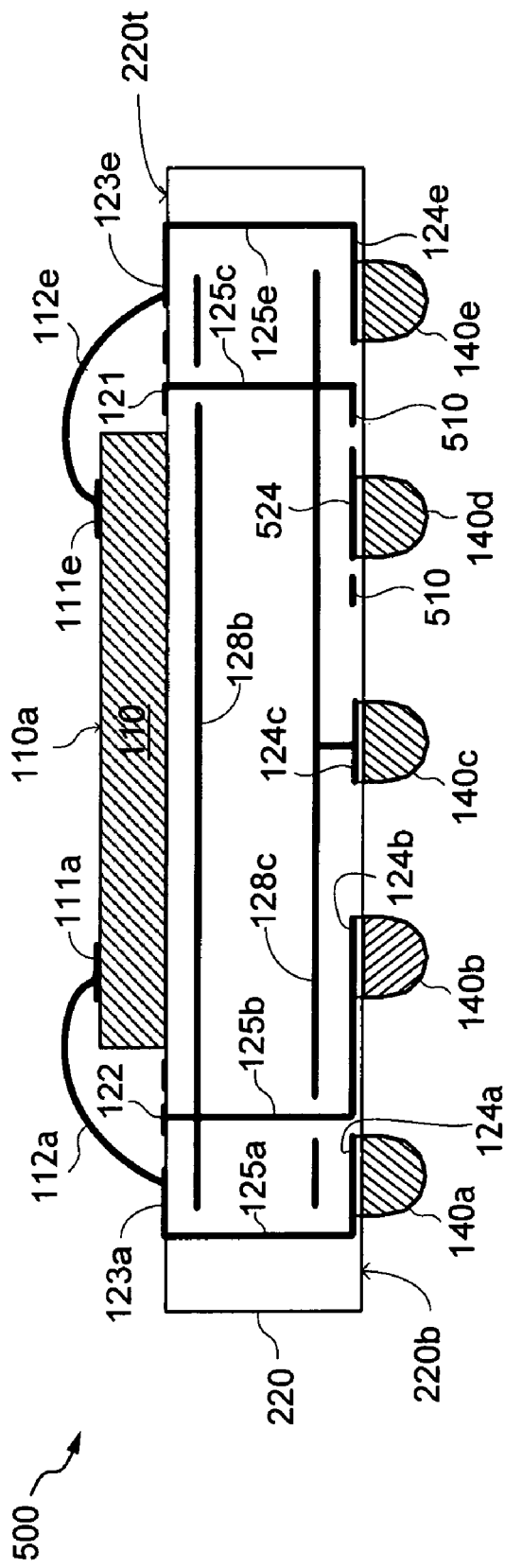
FIG. 5A is a sectional side view of another embodiment of the IC package of FIG. 2A having an embedded conductive ring structure that provides ESD protection.

FIGS. 5A-5B show an IC package 500 including a conductive ring 510 that is another embodiment of ESD protection structure 210 of FIG. 2A. Conductive ring 510 is formed within substrate 220 and laterally surrounds a land pad 524 of NC pin 140d, where land pad 524 is formed in accordance with some embodiments of the present invention. Conductive ring 510 is electrically coupled to the VSS power plane 128c by conductive via 125c. Because conductive ring 510 laterally surrounds the land pad 524 of NC pin 140d, any undesirable charge accumulation in portions of the substrate 220 proximate the NC pin's land pad 524 safely arcs to conductive ring 510 and is thereafter discharged to the VSS power plane through the conductive via 125c.

Conductive ring 510 can be formed using well-known techniques. For some embodiments, conductive ring 510 can be formed from the same metal layer (e.g., metal layer 223b of FIG. 4A) that is used to form land pads 124 and 524 using well-known pattern and etching techniques, for example, so that conductive ring 510 and the land pad 524 of the NC pin are co-planar with respect to each other.

Further, FIG. 5B shows a top plan view of one embodiment of the NC pin's land pad 524 and conductive ring 510. In accordance with some embodiments of the present invention, the NC pin's land pad 524 is fabricated to include a protruding portion 524b that laterally extends beyond the circular portion 524a of land pad 524 towards conductive ring 510 so that the protruding portion 524b is in close proximity to conductive ring 510. Minimizing the distance between land pad 524 and conductive ring 510 encourages any charge accumulation around land pad 524 to arc to conductive ring 510 and thus safely dissipate to ground plane 128c through conductive via 125c, thereby maximizing the effectiveness of conductive ring 510 in providing ESD protection for the NC pin 140d. Otherwise, if the NC pin's land pad 524 included only the circular portion 524a, as is typical in the fabrication of solder ball land pads, charge accumulation surrounding the NC pin's land pad may not be able to successfully arc to conductive ring 510, which can result in damage to the IC package.

For other embodiments, conductive ring 510 may be electrically connected to power plane 128c by a conductive via other than via 125c (e.g., by a dedicated conductive via electrically coupling conductive ring 510 to the substrate's ground plane). Further, for other embodiments, conductive ring 510 may be electrically coupled to the VDD power plane 128b, or alternatively electrically coupled to a conductive trace 121 or 122 that provides VSS or VDD to the bonding pads of die 110.

Although the present invention has been described in connection with several embodiments, it is understood that the present invention is not limited to the embodiments disclosed, but is capable of various modifications, which would be apparent to a person skilled in the art. Thus, the present invention is limited only by the following claims.

What is claimed is:

1. An integrated circuit (IC) package, comprising:
   a package substrate for receiving a die mounted on a top surface of the substrate and having a plurality of land pads formed on a bottom surface of the substrate, the die having a plurality of bonding pads, at least one bonding pad of the plurality of bonding pads being electrically coupled to a first land pad of the plurality of land pads;
   at least one no-connect pin connected to a second land pad of the plurality of land pads, wherein the at least one no-connect pin is not coupled to any bonding pad of the plurality of bonding pads of the die;
   a power plane formed within the substrate; and
   an electrostatic discharge (ESD) protection structure formed within the substrate, wherein the ESD protection structure comprises a resistive element coupled between the second land pad and the power plane to provide an electrical path to dissipate accumulated charge from an area of the substrate around the second land pad to the power plane.

2. The IC package of claim 1, wherein the ESD protection structure is contained entirely within the substrate.

3. The IC package of claim 1, wherein the resistive element is formed in a portion of the substrate between the second land pad associated with the no-connect pin and the power plane and is electrically coupled to the second land pad and to the power plane.

4. The IC package of claim 3, wherein the resistive element is in physical contact with the second land pad associated with the no-connect pin and with the power plane.

5. The IC package of claim 3, wherein the resistive element is housed in a cavity formed in the substrate.

6. The IC package of claim 5, wherein the resistive element comprises a resistive ink printed in the cavity.

7. The IC package of claim 3, wherein the IC package further comprises a second no-connect pin connected to a third land pad of the plurality of land pads, and wherein the resistive element is electrically coupled to both the second and third land pads.

8. An integrated circuit (IC) package, comprising:
   a package substrate having a die mounted on a top surface of the substrate and having a plurality of land pads formed on a bottom surface of the substrate, the die having a plurality of bonding pads, at least one bonding pad of the plurality of bonding pads being electrically coupled to a first land pad of the plurality of land pads;
   a first no-connect pin connected to a second land pad of the plurality of land pads, wherein the first no-connect pin is not coupled to any bonding pad of the plurality of bonding pads of the die;
   a power plane formed within the substrate; and
   a resistive element formed in the substrate and electrically coupled to the second land pad and to the power plane to provide an electrical path between the second land pad and the power plane.

9. The IC package of claim 8, wherein the resistive element is configured to dissipate accumulated charge from an area of the substrate around the second land pad associated with the first no-connect pin to the power plane.

10. The IC package of claim 9, wherein the resistive element is housed in a cavity formed in the substrate.

11. The IC package of claim 10, wherein the resistive element comprises a resistive ink printed in the cavity.

12. The IC package of claim 8, wherein the IC package further comprises a second no-connect pin connected to a third land pad of the plurality of land pads, and wherein the resistive element is electrically coupled to both the second and third land pads.

13. An integrated circuit (IC) package, comprising:
- a package substrate having a die mounted on a top surface of the substrate and having a plurality of land pads formed on a bottom surface of the substrate, the die having a plurality of bonding pads, at least one bonding pad of the plurality of bonding pads being electrically coupled to a first land pad of the plurality of land pads;
- a no-connect pin connected to a second land pad of the plurality of land pads, wherein the no-connect pin is not coupled to any bonding pad of the plurality of bonding pads of the die;
- a power plane formed within the substrate; and
- a conductive ring formed in the substrate and laterally surrounding the second land pad associated with the no-connect pin and electrically coupled to the power plane, wherein the second land pad associated with the no-connect pin comprises a circular portion disposed over the no-connect pin and having a protruding portion extending outwardly from the circular portion toward the conductive ring, wherein the protruding portion encourages charge accumulated around the second land pad to arc to the conductive ring.

14. The IC package of claim 13, wherein the conductive ring is configured to dissipate accumulated charge from an area of the substrate around the second land pad associated with the no-connect pin to the power plane.

15. The IC package of claim 13, wherein the conductive ring is not in physical contact with the second land pad associated with the no-connect pin, and the conductive ring and the second land pad associated with the no-connect pin are co-planar with respect to each other.

* * * * *